United States Patent [19]

Chen et al.

[11] Patent Number: 5,776,833
[45] Date of Patent: Jul. 7, 1998

[54] METHOD FOR FORMING METAL PLUG

[75] Inventors: Hsi-Chieh Chen; Champion Yi, both of Chu Tung Town; Pei-Jan Wang; Yeong-Ruey Shiue, both of Hsin Chu, all of Taiwan

[73] Assignee: Mosel Vitelic Inc., Hsin Chu, Taiwan

[21] Appl. No.: 707,758

[22] Filed: Sep. 4, 1996

[51] Int. Cl.$^6$ .................................................. H01L 21/44
[52] U.S. Cl. .......................... 438/672; 438/629; 438/639; 438/645; 438/656; 438/691
[58] Field of Search .............................. 437/190, 192, 437/195, 225, 228, 235, 238; 438/672, 629, 639, 645, 656, 691

[56] References Cited

U.S. PATENT DOCUMENTS

| 4,833,519 | 5/1989 | Kawano et al. | 437/190 |
|---|---|---|---|
| 4,884,123 | 11/1989 | Dixit et al. | 437/190 |
| 4,960,732 | 10/1990 | Dixit et al. | 437/190 |
| 5,310,626 | 5/1994 | Fernandes et al. | 430/327 |
| 5,364,817 | 11/1994 | Lur et al. | 437/190 |
| 5,420,072 | 5/1995 | Fiordalice et al. | 437/190 |
| 5,534,462 | 7/1996 | Fiordalice et al. | 437/190 |
| 5,539,256 | 7/1996 | Mikagi | 257/763 |
| 5,578,523 | 11/1996 | Fiordalice et al. | 437/190 |

*Primary Examiner*—Charles L. Bowers, Jr.
*Assistant Examiner*—Lynne A. Gurley
*Attorney, Agent, or Firm*—Oblon, Spivak, McClelland, Maier & Neustadt, P.C.

[57] ABSTRACT

A method for forming a metal plug is provided. The method includes: a) forming a metal contact window in a substrate having an oxide layer; b) forming a barrier layer over a top surface of the oxide layer and a wall defining the metal contact window; c) forming a metal layer covering the barrier layer and filling up the metal contact window; d) removing a portion of the metal layer located above the barrier layer covering the top surface of the oxide layer by a chemical mechanical polishing method; and e) removing the barrier layer covering the top surface of the oxide layer by an etching method.

22 Claims, 5 Drawing Sheets

METHOD FOR FORMING METAL PLUG

FIELD OF THE INVENTION

The present invention relates to a method for forming a metal plug, especially to a chemical mechanical polishing method for forming a metal plug.

BACKGROUND OF THE INVENTION

When the integration of an integrated circuit is increased, the surface of the wafer cannot provide enough surface area for the interconnections of elements. For that reason, processes for manufacturing multi-metal layers are developed. In a multilevel metallization process, metal plugs are used to connect different metal layers or serve as MOS electrodes connected to other metal layer.

Referring to FIGS. 1 and 2, when forming metal plugs 51, contact windows 3 are provided on a substrate 1 having an oxide layer 2. The contact windows 3, disposed in the oxide layer 2, are filled up with the metal layer 5. Aluminum or tungsten is often applied for forming the metal plugs 51. For avoiding a short circuit caused by the spiking phenomenon occuring at the contact interface of the aluminum and the silicon substrate, or increasing the adhesive ability of the tungsten layer, a barrier layer 4 is applied between the oxide layer 2 and the metal layer 5.

Titanium nitride or tungsten nitride is often used as the material of the barrier layer 4. Titanium nitride layer is more often used since it serves as a good barrier layer even in high-temperature surroundings. The barrier layer 4 preferably further includes a titanium layer in cooperation with the titanium nitride layer to form a better ohmic contact between the metal layer 5 and the oxide layer 2.

Tungsten is often used as the material of the metal layer 5 because it is formed by a low pressure chemical vapor deposition and is able to form an excellent step coverage on the wafer. A tungsten plug is often formed by a process of blanket tungsten deposition to form the tungsten layer 5, coupled with a tungsten etch back process for removing excess tungsten to form the tungsten plug 51.

To obtain a better planarity, a chemical-mechanical polishing (CMP) method is applied for removing the excess tungsten. A slurry of a CMP often contains colloidal silica or dispersed aluminum mixed with basic solution such as KOH or $NH_4OH$ solution. The size distribution of the slurry particles is ranged from about 0.1 μm to about 2.0 μm. These high-abrasive particles provide a mechanical polishing to the wafer surface. On the other hand, the slurry often contains oxidants and organic agents for assistting a chemical removal process.

A conventional CMP applied in a tungsten etch back process, which removes both metal layer 5 and underneath barrier layer 4, has several disadvantages:

1. The selectivity of tungsten/titanium in a CMP is about 10/1. To remove the Ti/TiN barrier layer is more difficult than to remove the tungsten layer.
2. There lacks an effective end point detection system for a CMP. If the barrier layer 4 is also removed by a CMP process, an oxide layer erosion and a tungsten plug recess will happen due to an over-polishing.
3. The oxide layer surface is scratched during the CMP process and thus a second table polishing is needed.

SUMMARY OF THE INVENTION

An object of the present invention is to provide a method for forming a metal plug with a minimized plug recess.

The other object of the present invention is to provide a method for forming a metal plug having a top portion actually positioned above the oxide layer after the barrier layer is removed.

Another object of the present invention is to provide a method for forming a metal plug without an erosion and a micro-scratch of the oxide layer.

A further object of the present invention is to provide a method for forming a metal plug without the necessity of the second table polishing of a CMP.

A still further object of the present invention is to provide a method for forming a metal plug with a reduced polishing time.

According to the present invention, a method for forming a metal plug is provided. The method includes: a) forming a metal contact window in a substrate having an oxide layer; b) forming a barrier layer over a top surface of the oxide layer and a wall defining the metal contact window; c) forming a metal layer covering the barrier layer and filling up the metal contact window; d) removing a portion of the metal layer located above the barrier layer covering the top surface of the oxide layer by a chemical mechanical polishing method; and e) removing the barrier layer covering the top surface of the oxide layer by an etching method.

In accordance with one aspect of the present invention, the metal plug is preferably formed by the metal layer filling up the metal contact window, and a top portion of the metal plug is preferably revealed above the top surface of the oxide layer when the barrier layer covering thereon is removed.

In accordance with another aspect of the present invention, the step a) preferably includes steps of: a1) forming a photoresistant layer over the oxide layer; a2) defining a pattern of the metal contact window on the photoresistant layer; a3) etching the oxide layer according to the pattern of the metal contact layer; and a4) removing the remaining portion of the photoresistant layer.

In accordance with another aspect of the present invention, the oxide layer is preferably a silicon dioxide layer.

In accordance with another aspect of the present invention, the barrier layer preferably includes a titanium layer and a titanium nitride layer. The titanium layer is preferably formed by a magnetron DC sputtering method under a pressure of about 1 Torr to 100 Torr.

In accordance with another aspect of the present invention, the titanium layer preferably has a thickness of about 200 Å to 500 Å.

In accordance with another aspect of the present invention, the titanium nitride layer is preferably formed by a nitridation process. The nitridation process is preferably performed in a rapid thermal process.

In accordance with another aspect of the present invention, the titanium nitride layer is preferably formed by a reactive sputtering method under a pressure of about 1 mTorr to 100 mTorr at a temperature of about 300° C.

In accordance with another aspect of the present invention, the titanium nitride layer is preferably formed by a chemical vapor deposition at a temperature of about 400° C. to 500° C.

In accordance with another aspect of the present invention, the titanium nitride layer preferably has a thickness of about 500 Å to 1500 Å.

In accordance with another aspect of the present invention, the metal layer is preferably a tungsten layer. The tungsten layer is preferably formed by a blanket tungsten deposition. The tungsten is preferably deposited at a temperature of about 300° C. to 550° C. under a pressure of 1 Torr to 100 Torr.

In accordance with another aspect of the present invention, the metal layer preferably has a thickness of about 5000 Å to 10000 Å.

In accordance with another aspect of the present invention, the barrier layer covering the top surface of the oxide layer is preferably etched by a wet etching.

In accordance with another aspect of the present invention, the barrier layer covering the top surface of the oxide layer is preferably etched by a dry etching. The dry etching is preferably a sputtering etching, a plasma etching or a reactive ion etching.

In accordance with another aspect of the present invention, the barrier layer is preferably a titanium nitride layer.

In accordance with another aspect of the present invention, the barrier layer is preferably a tungsten nitride layer.

The present invention may best be understood through the following description with reference to the accompanying drawings, in which:

DETAILED DESCRIPTION OF THE PREFERRED EMBODIMENTS

For forming a structure with metal plugs, steps according to a prefered embodiment of the present invention are described hereinafter with reference to FIGS. 3(a)-3(e).

Figure 1:
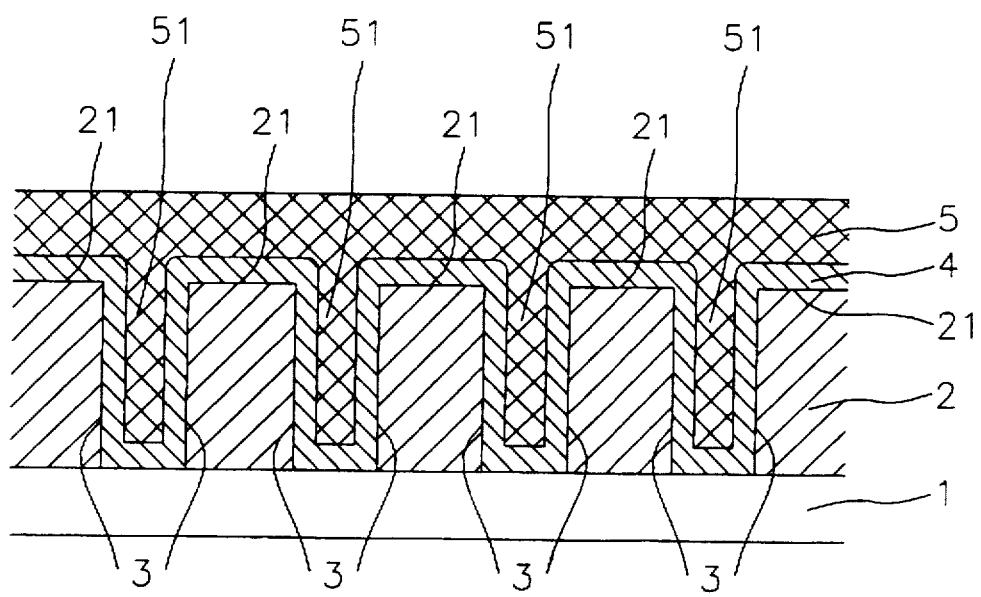
FIG. 1 illustrates a structure forming thereon metal plugs by a blanket tungsten deposition.
Figure 2:
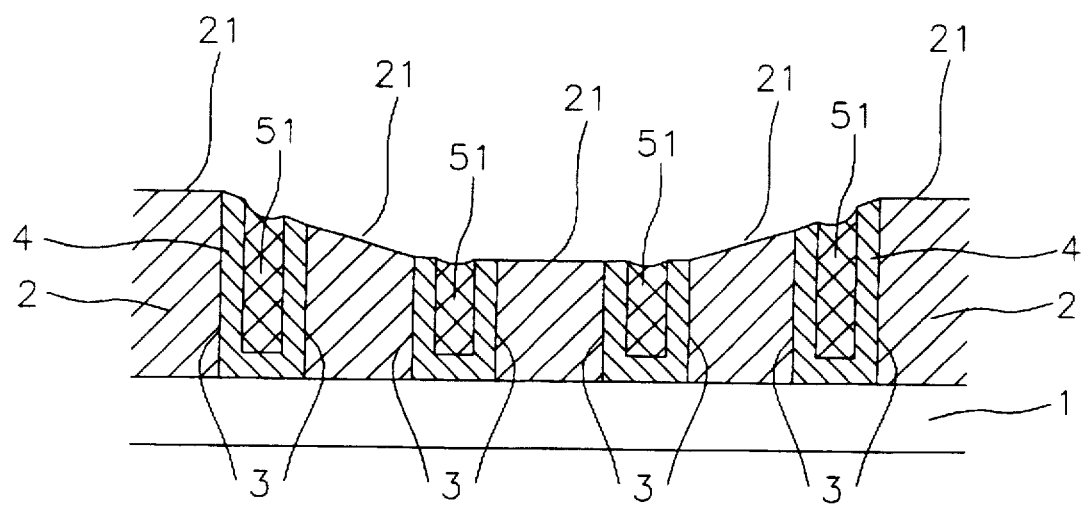
FIG. 2 illustrates a structure with metal plugs formed by a conventional CMP process.
Figure 3A:
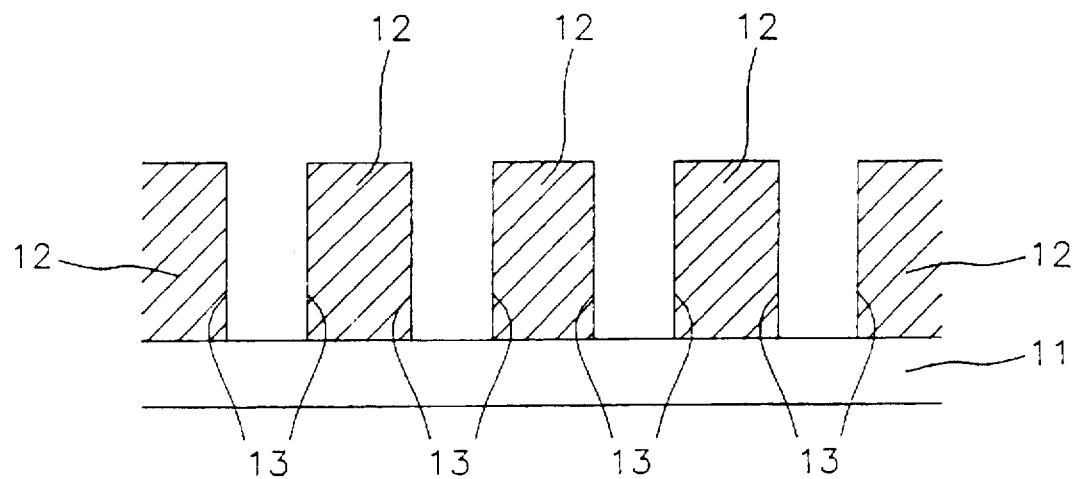
FIGS. 3(a)-3(e) illustrates a preferred embodiment for forming metal plugs according to the present invention.

FIG. 3(a) includes steps of:
- a1) forming a silicon dioxide layer 12 over a silicon substrate 11;
- a2) spin-coating a photoresistant layer (not shown) on the silicon dioxide layer 12;
- a3) defining a pattern of a metal contact window 13 on the photoresistant layer by a photolithography process;
- a4) etching a portion of the silicon dioxide layer 12 according to the pattern of the metal contact window 13; and
- a5) stripping the remaining photoresistant layer.

Figure 3B:
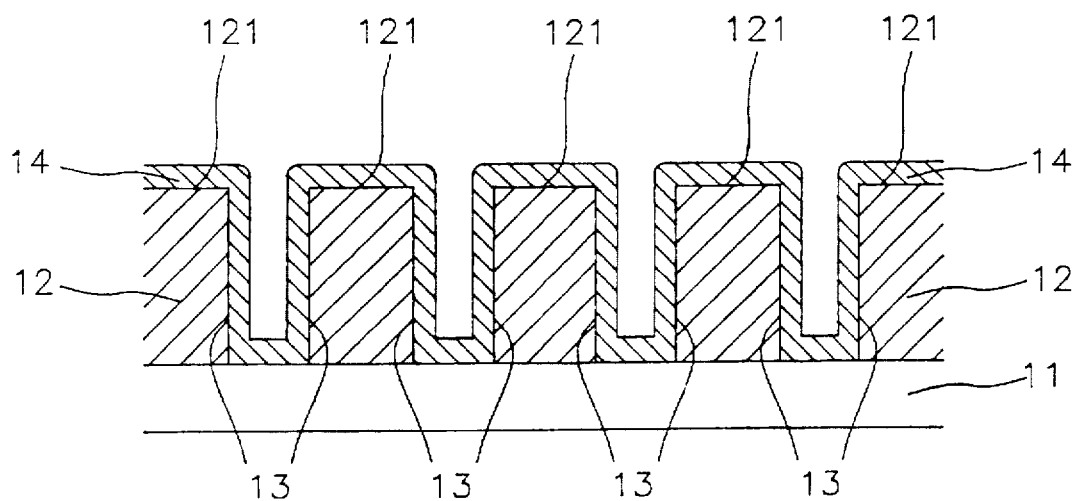

FIG. 3(b) includes a step of:
- b1) forming a barrier layer 14 on the top surface 121 of the silicon dioxide layer 12. The barrier layer 14 includes a titanium layer having a thickness of about 200 Å to 500 Å, and a titanium nitride having a thickness of about 500 Å to 1500 Å.

The titanium layer can be formed by a magnetron DC sputtering method under a pressure ranged from about 1 mTorr to 100 mTorr.

A method for forming the titanium nitride is nitridation. A titanium layer is formed by the magnetron DC sputtering titanium nitride under an $N_2$ or $NH_3$ atmosphere at a high temperature. A rapid thermal process can be applied in the nitridation process.

The other method for forming the titanium nitride layer is a reactive sputtering method. Such a process is preformed at a temperature of about 300° C. under a pressure of about 1 mTorr to 100 mTorr.

A further method for forming the titanium nitride layer is a chemical vapor deposition at a temperature of about 400° C. to 500° C.

Figure 3C:
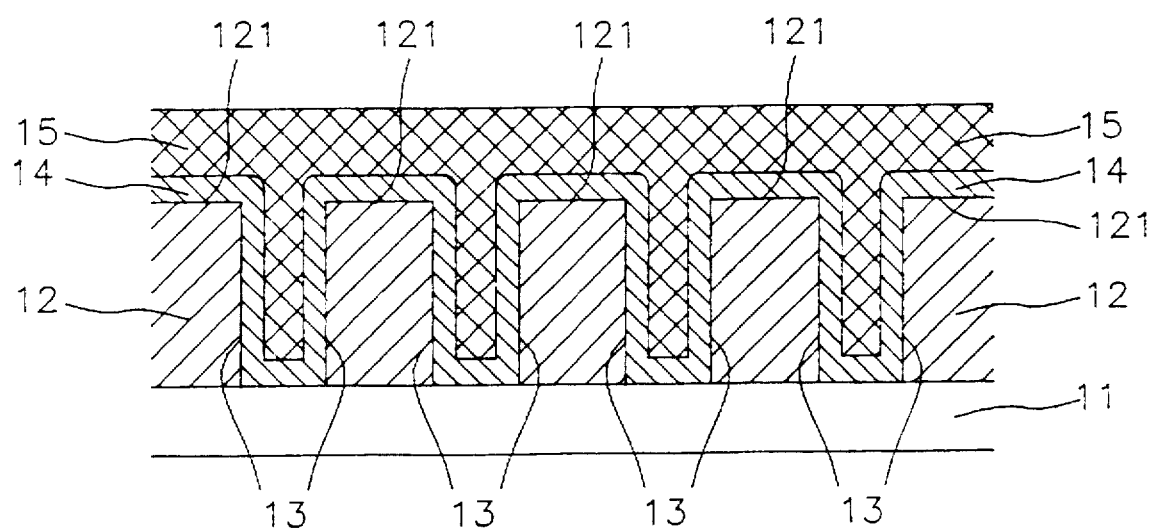

FIG. 3(c) includes a step of:
- c1) forming a tungsten layer 15 having a thickness of about 5000 Å to 10000 Å over the barrier layer 14 and filling up the metal contact window 13. The tungsten layer 15 is formed by a blanket tungsten deposition performed by a low pressure chemical vapor deposition at a temperature of about 300° C. to 500° C. under a pressure of about 1 to 100 Torr.

Figure 3D:
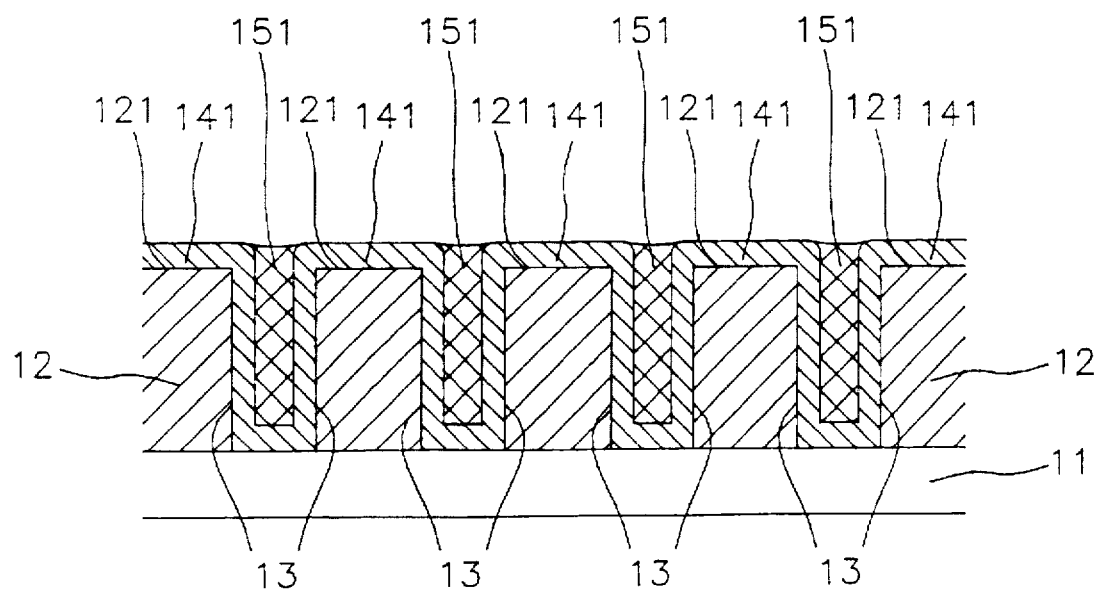

FIG. 3(d) includes a step of:
- d1) removing the excess portion of the tungsten layer 15 by a CMP process. The CMP process is stopped on the top surface 141 of the barrier layer 14. Since the selectivity of tungsten/titanium in a CMP is about 10/1, the Ti/TiN layer 14 can serve as a good stop layer to prevent from over-polishing and thus avoid erosion and micro-scratch of the oxide layer 12. The recess of the tungsten plug 151 is minimized by the Ti/TiN stop layer 14.

Figure 3E:
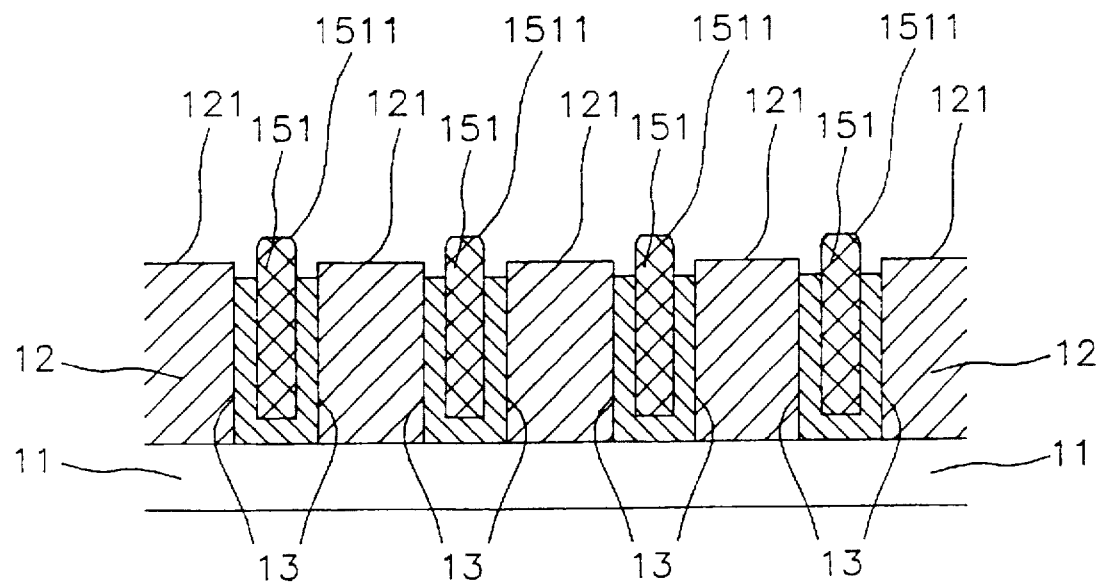

FIG. 3(e) includes a step of:
- e1) removing or stripping the barrier layer 141 by a wet chemistry or a dry etching process. The dry etching process could be a sputtering etching, a plasma etching or a reactive ion etching.

Since the CMP procedure for removing the barrier layer 4 in a conventional process is replaced by an etching method, the over-polishing problem is avoided. Consequently, the top portion 1511 of the tungsten plug 151 will not be destroyed by the over-polishing, which makes the plug 151 protrude above the top surface 121 of the oxide layer 12. As a result, the contact resistance of the subsequent metal interconnection is reduced by the protruding tungsten plug 151.

The Ti/TiN stop layer enables a wafer to have a good planarity performed by the CMP process without an erosion and micro-scratch of the oxide layer and the recess of the plug. Furthermore, the throughput is improved by reducing the polishing time and by skipping the second table polishing.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A method for forming a metal plug, comprising:
   a) forming a metal contact window in a substrate having an oxide layer,
   b) forming a barrier layer having a top surface portion covering a top surface of said oxide layer and a wall portion covering a wall defining said metal contact window;
   c) forming a metal layer having a first portion covering said top surface portion of said barrier layer and a second portion filling up said metal contact window to form a metal plug;
   d) chemical mechanical polishing said metal layer until said first portion of said metal layer is removed and said top surface portion of said barrier layer is exposed; and e) etching said barrier layer to remove said top surface portion of said barrier layer wherein a side portion of said metal plug is exposed and protrudes above said top surface of said oxide layer, and to remove a portion of said wall portion of said barrier layer below said top surface of said oxide layer.

2. A method according to claim 1 wherein said step a) includes the steps of:

a1) forming a photoresistant layer over said oxide layer;

a2) defining a pattern of said metal contact window on said photoresistant layer;

a3) etching said oxide layer according to said pattern of said metal contact window; and a4) removing said photoresistant layer.

3. A method according to claim 1 wherein said oxide layer is a silicon dioxide layer.

4. A method according to claim 1 wherein said barrier layer includes a titanium layer and a titanium nitride layer.

5. A method according to claim 4 wherein said titanium layer is formed by a magnetron DC sputtering method under a pressure of about 1 Torr to 100 Torr.

6. A method according to claim 4 wherein said titanium layer has a thickness of about 200 Å to 500 Å.

7. A method according to claim 4 wherein said titanium nitride layer is formed by a nitridation process.

8. A method according to claim 7 wherein said nitridation process is performed in a rapid thermal process.

9. A method according to claim 4 wherein said titanium nitride layer is formed by a reactive sputtering method under a pressure of about 1 mTorr to 100 mTorr at a temperature of about 300° C.

10. A method according to claim 4 wherein said titanium nitride layer is formed by a chemical vapor deposition at a temperature of about 400° C. to 500° C.

11. A method according to claim 4 wherein said titanium nitride layer has a thickness of about 500 Å to 1500 Å.

12. A method according to claim 1 wherein said metal layer is a tungsten layer.

13. A method according to claim 12 wherein said tungsten layer is formed by a blanket tungsten deposition.

14. A method according to claim 13 wherein said tungsten is deposited at a temperature of about 300° C. to 550° C. under a pressure of 1 Torr to 100 Torr.

15. A method according to claim 1 wherein said metal layer has a thickness of about 5000 Å to 10000 Å.

16. A method according to claim 1 wherein said etching is a wet etching.

17. A method according to claim 1 wherein said etching is a dry etching.

18. A method according to claim 17 Wherein said dry etching is a sputtering etching.

19. A method according to claim 17 wherein said dry etching is a plasma etching.

20. A method according to claim 17 wherein said dry etching is a reactive ion etching.

21. A method according to claim 1 wherein said barrier layer is a titanium nitride layer.

22. A method according to claim 1 wherein said barrier layer is a tungsten nitride layer.

* * * * *